United States Patent
Fujimura et al.

(10) Patent No.: US 7,808,537 B2
(45) Date of Patent: Oct. 5, 2010

(54) PHOTOELECTRIC CONVERSION APPARATUS WITH FULLY DIFFERENTIAL AMPLIFIER

(75) Inventors: Masaru Fujimura, Sagamihara (JP); Masanori Ogura, Atsugi (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 379 days.

(21) Appl. No.: 11/850,276

(22) Filed: Sep. 5, 2007

(65) Prior Publication Data
US 2008/0062295 A1 Mar. 13, 2008

(30) Foreign Application Priority Data
Sep. 7, 2006 (JP) ............... 2006-242930

(51) Int. Cl.
H04N 3/15 (2006.01)
H04N 5/335 (2006.01)
(52) U.S. Cl. .................................. 348/300
(58) Field of Classification Search .............. 348/300, 348/241, 243, 294, 302
See application file for complete search history.

(56) References Cited

U.S. PATENT DOCUMENTS

| | | | | |
|---|---|---|---|---|
| 5,844,431 A | * | 12/1998 | Chen | 327/94 |
| 5,936,469 A | * | 8/1999 | Alexander et al. | 330/253 |
| 6,670,990 B1 | | 12/2003 | Kochi et al. | 348/310 |
| 6,801,258 B1 | | 10/2004 | Pain et al. | |
| 6,906,586 B2 | | 6/2005 | Sakurai | |
| 6,960,751 B2 | | 11/2005 | Hiyama et al. | 250/208.1 |
| 7,016,089 B2 | | 3/2006 | Yoneda et al. | 358/482 |
| 7,110,030 B1 | | 9/2006 | Kochi et al. | 348/308 |
| 7,208,983 B2 | | 4/2007 | Imaizumi et al. | |
| 7,227,208 B2 | | 6/2007 | Ogura et al. | 257/292 |
| 7,295,143 B2 | * | 11/2007 | Ambo et al. | 348/241 |
| 7,297,917 B2 | * | 11/2007 | Olsen et al. | 348/300 |
| 7,321,110 B2 | | 1/2008 | Okita et al. | 250/208.1 |
| 7,324,144 B1 | | 1/2008 | Koizumi | 348/294 |
| 2002/0171773 A1 | * | 11/2002 | Gower et al. | 348/691 |
| 2003/0164887 A1 | | 9/2003 | Koizumi et al. | 348/308 |
| 2004/0027471 A1 | | 2/2004 | Koseki et al. | |
| 2004/0041080 A1 | * | 3/2004 | Barna et al. | 250/214 R |
| 2004/0051802 A1 | * | 3/2004 | Krymski | 348/308 |
| 2005/0200411 A1 | * | 9/2005 | Chang et al. | 330/253 |

(Continued)

FOREIGN PATENT DOCUMENTS

JP 11-103422 A 4/1999

(Continued)

Primary Examiner—Jason Whipkey
(74) Attorney, Agent, or Firm—Fitzpatrick, Cella, Harper & Scinto

(57) ABSTRACT

To provide a configuration including a fully differential amplifier in which decrease in a reading speed can be suppressed. A photoelectric conversion apparatus according to the present invention includes a pixel area where a plurality of pixels are arranged; an amplifier configured to amplify a signal from the pixel area; a plurality of signal paths for transmitting the signals from the pixel area to the amplifier. The amplifier is a fully differential amplifier which includes a plurality of input terminals including a first input terminal and a second input terminal to which the signals from the plurality of signal paths are supplied and a plurality of output terminals including a first output terminal and a second output terminal and the input terminals and the output terminals have no feedback path provided therebetween.

9 Claims, 11 Drawing Sheets

U.S. PATENT DOCUMENTS

| | | | |
|---|---|---|---|
| 2006/0007329 A1* | 1/2006 | Panicacci | 348/241 |
| 2006/0043439 A1 | 3/2006 | Koizumi | 257/291 |
| 2006/0043440 A1 | 3/2006 | Hiyama et al. | 257/291 |
| 2006/0044434 A1 | 3/2006 | Okita et al. | 348/294 |
| 2006/0044439 A1 | 3/2006 | Hiyama et al. | 348/308 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |
| 2007/0086790 A1* | 4/2007 | Tai et al. | 398/202 |

FOREIGN PATENT DOCUMENTS

| | | |
|---|---|---|
| JP | 2002-507863 A | 3/2002 |
| JP | 2003-69347 A | 3/2003 |
| JP | 2003-511920 A | 3/2003 |
| JP | 2003-348464 A | 12/2003 |
| JP | 2004-186790 A | 7/2004 |
| JP | 2004-357059 A | 12/2004 |
| JP | 2006-60512 A | 3/2006 |
| WO | 99/48281 A1 | 9/1999 |
| WO | 01/26382 A1 | 4/2001 |

* cited by examiner

PHOTOELECTRIC CONVERSION APPARATUS WITH FULLY DIFFERENTIAL AMPLIFIER

BACKGROUND OF THE INVENTION

1. Field of the Invention

The present invention relates to a photoelectric conversion apparatus widely used in particularly a video camera, a digital still camera, and an image input apparatus for an image scanner. In particular, the invention relates to an output circuit of the photoelectric conversion apparatus.

2. Description of the Related Art

In a conventional photoelectric conversion apparatus, an electromagnetic field noise emanating from the outside generates a noise voltage in wiring in the apparatus, which becomes a noise output. Thus, an S/N (signal-to-noise) ratio is degraded. Japanese Patent Laid-Open No. 2004-186790 discloses a configuration of a differential amplifier provided to a horizontal common output line. In the differential amplifier, a differential output between a signal level (S) and a reset level (N) is output. FIG. 11 illustrates a photoelectric conversion apparatus disclosed in Japanese Patent Laid-Open No. 2004-186790. Two horizontal common output lines (20a and 20b) are arranged, and a capacitive feedback type fully differential amplifier, in other words, a differential input-differential output amplifier 23 is arranged.

Capacitors 24a and 24b are arranged between an output terminal functioning as a feedback loop of a differential amplifier 23 and the horizontal common output lines. This configuration is made for obtaining a constant open loop gain, and the open loop gain of the differential amplifier 23 determines the accuracy and speed.

In recent years, there is a trend that the size of a photoelectric conversion apparatus used in a digital single-lens reflex camera is set larger and the number of pixels is increased. In such circumstances, with the configuration disclosed in Japanese Patent Laid-Open No. 2004-186790, the number of columns connected to the horizontal common output line is increased and the number of switches connected to the horizontal common output line is also increased. Thus, the parasitic capacitance of the horizontal common output line is increased. According to the configuration of the differential amplifier illustrated in FIG. 11, due to the increase in the parasitic capacitance of the horizontal common output line, the reading speed is lowered and the reading gain dispersion becomes larger. Hereinafter, the above-mentioned phenomena will be described in detail.

In FIG. 11, from CapN and CapS, a time constant $\tau$ of a path of a signal to be input to the differential amplifier via the horizontal common output line is examined. The parasitic capacitance of the horizontal common output line becomes a lead on the output terminal and affects the speed via the capacitors 24a and 24b functioning as the feedback paths. To be more specific, when a capacitance value of CapS and CapN is set as CT, a capacitance value of the capacitors 24a and 24b is set as CF, a parasitic capacitance of the horizontal common output line is set as CH, an external capacitance value of an output terminal in the differential amplifier is set as CL, and an equivalent voltage-current conversion coefficient of the differential amplifier is set as Gm, the time constant $\tau$ can be represented by the following expression.

$$\tau = f(CT, CF, CH, CL) \quad (1)$$
$$= CL(CT+CH) + CL \cdot CF + (CT+CH) \cdot CF/Gm \cdot C2$$

For example, in a case where CL=10 pF, CT=2.5 pF, CF=1.25 pF, CH=10 pF, and Gm=1/100 ($\Omega$−1) are set, the time constant $\tau$=12.25 nS is obtained. If 5$\tau$ is necessary for stability in a waveform response and 5$\tau$ is necessary for a waveform stability period, only an operation of approximately 7.5 MHz can be obtained. This decrease in speed significantly affects the high speed reading.

In addition, an approximate value of a gain A can be calculated on the basis of CT/CF. However, to be specific, the value is affected by the capacitance of the horizontal common output line and the open loop gain of the differential amplifier. This is represented by the following expression.

$$A = (CT/CF) \times [1-(CF+CT+CH)/(CF \cdot Aop)] \quad (2)$$

Wherein Aop denotes an open loop gain of the differential amplifier. To elaborate, with respect to (CT/CF) that is an approximate gain, when the parasitic capacitance CH of the horizontal common output line is large, the value is deviated from the approximate value and the gain is decreased. For example, when the same capacitance values are set as in the above-mentioned case and Aop is set as 40 dB, the error is 11%. Also, when Aop is set as 60 dB, the error is 1.1%. In this way, the error regarding the gain of the differential amplifier depends on the parasitic capacitance of the horizontal common output line and the open loop gain of the differential amplifier.

Also, in the differential amplifier using a feedback path, a high gain amplifier is used. This is because from Expression (2), as the open loop gain Aop of the differential amplifier is higher, the gain error is reduced. However, in a case where an amplifier of a high gain like 60 dB (1000 fold) is used, in a period where no signal is input, a high gain is caused even with respect to a minute input circuit offset, and a large output offset may be generated in some cases. An output offset generated at the same level as the two terminals of the differential output terminal is referred to as common-mode voltage, which can be suppressed through a differential computation performed in a signal processing unit in a later stage. However, in order to avoid a situation where the voltage level exceeds the input range of the signal processing unit, it is necessary to perform an adjustment at the common-mode level. A circuit configured to perform this adjustment is a common-mode feedback (CMFB) circuit. In this circuit, the two terminals for the differential output are monitored, an average level between the two is obtained, and feedback is applied to the differential amplifier so that the average becomes the same level as a reference voltage Vref.

However, when the feedback circuit using the CMFB is formed, a monitor circuit for taking out the output of the differential amplifier is connected to the output terminal, and a parasitic load is generated on the output terminal to decrease the operational speed. Also, it is necessary to prepare a phase compensation capacitance for the feedback path so that an oscillation is not caused. This capacitance load also becomes a factor of decreasing the operational speed.

SUMMARY OF THE INVENTION

Therefore, the present invention provides a configuration including a fully differential amplifier in which decrease in a reading speed can be suppressed.

In view of the above-described problems, according to an aspect of the present invention, there is provided a photoelectric conversion apparatus including a pixel area where a plurality of pixels are arranged; an amplifier configured to amplify a signal from the pixel area; and a plurality of signal paths for transmitting the signals from the pixel area to the amplifier, in which the amplifier is a fully differential amplifier which comprises a plurality of input terminals including a first input terminal and a second input terminal to which the signals from the plurality of signal paths are supplied and a plurality of output terminals including a first output terminal and a second output terminal and the input terminals and the output terminals have no feedback path provided therebetween.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

Description of the Embodiments

Figure 1:
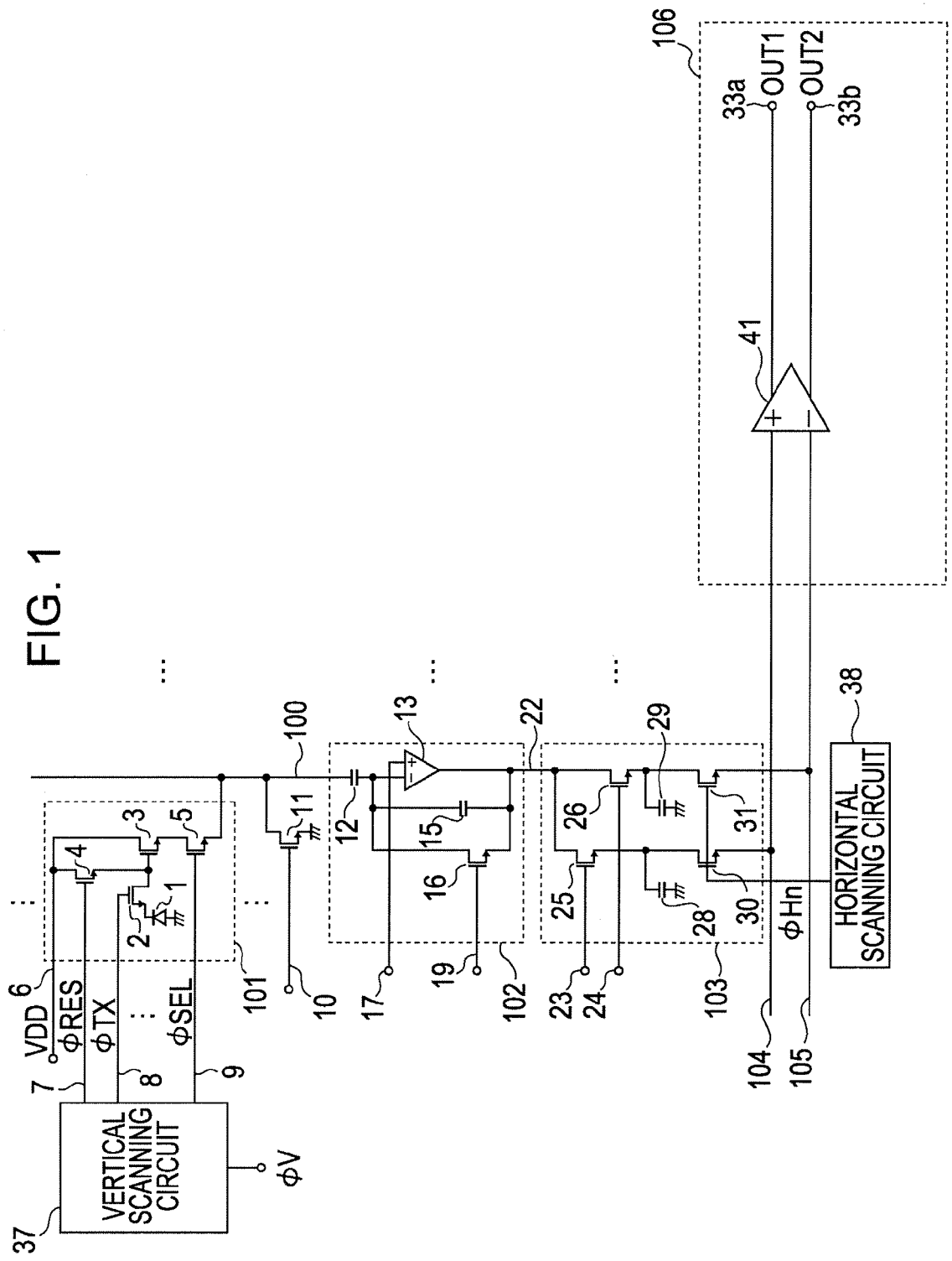
FIG. 1 is a diagram for describing an example of a photoelectric conversion apparatus according to the present invention.

FIG. 1 illustrates an example of a photoelectric conversion apparatus that can be applied to the present invention. In FIG. 1, the photoelectric conversion apparatus has a configuration including an amplifier for amplifying a signal from a pixel area. The amplifier is composed of a fully differential amplifier provided with a plurality of input terminals including a first input terminal and a second input terminal and a plurality of output terminals including a first output terminal and a second output terminal, and has a configuration where no feedback path is arranged between the input terminals and the output terminals.

According to such a configuration, with respect to the reading speed for the signal from the fully differential amplifier, it is possible to suppress an influence caused by a parasitic capacitance of a signal path for transmitting the signal to the input terminal of the amplifier.

Next, the configuration of the photoelectric conversion apparatus illustrated in FIG. 1 will be described. A pixel is denoted by reference numeral 101. An area where the plural pixels 101 are arranged is referred to as the pixel area. Herein, only one pixel is illustrated in the drawing but, for example, a plurality of pixels can be arranged in a matrix manner in the pixel area.

A photo diode 1 functions as a photoelectric conversion element and an amplifier MOS transistor 3 is configured to amplify a signal based on a charge of the photo diode. A gate of the amplifier MOS transistor 3 is connected to a floating diffusion (FD). Furthermore, a transfer switch 2 is used for transferring the charge of the photo diode to the FD, a reset switch 4 is used for supplying the FD with a predetermined voltage, and a selection switch 5 is used for selecting a pixel. The pixel is composed of these elements. However, the configuration is not limited to the above, and for example, such a configuration may be adopted that instead of using the selection switch, the pixel is selected by controlling the voltage to be supplied to the FD by using the reset switch. Also, a plurality of photoelectric conversion elements can share a particular element such as the amplifier MOS transistor.

Denoted by reference numeral 6 is a power supply for resetting. Control lines 7, 8, and 9 control the respective switches. These control lines are connected to a vertical scanning circuit 37 for sequentially selecting the respective rows and columns.

A vertical signal line 100 is configured to read the signal from the pixel for each signal column. Denoted by reference numerals 11 and 10 are a pixel current source and a power supply line, respectively. A clamp capacitor 12 is configured to hold the signal from the pixel. A first terminal of the clamp capacitor 12 is connected to the vertical signal line 100 in parallel with the pixel current source. A second terminal of the clamp capacitor 12 is connected to a gain circuit (column amplifier) 102 for each column. Denoted by reference numeral 103 is an offset cancel circuit. A signal obtained by superimposing an offset (noise) signal on a signal based on a charge generated through photoelectric conversion (optical signal) and a noise signal are held in a hold capacitor that will be described later.

The output of the offset cancel circuit 103 is transferred to horizontal common output lines 104 and 105 which function as signal paths for supplying the signals to input terminals of the amplifier to be described later. The horizontal common output lines 104 and 105 are connected to an amplifier 41, and the output of the amplifier 41 is output from an output terminal OUT. The amplifier 41 is composed of a fully differential amplifier that is provided with a plurality of input terminals including the first input terminal and the second input terminal and a plurality of output terminals including the first output terminal and the second output terminal. Then, no feedback path is structured between the input terminals and the output terminals and a differential input signal is amplified.

Next, a configuration of the column amplifier 102 will be described. Denoted by reference numeral 13 is an operational amplifier. A second terminal of the clamp capacitor 12 is connected to an inverting input terminal of the operational amplifier 13. A non-inverting input terminal of the operational amplifier 13 is supplied with a reference voltage from a reference voltage terminal 17. A first terminal of a feedback capacitor 15 is connected to an output terminal of the operational amplifier 13 and a second terminal of the feedback capacitor 15 is connected to the inverting input terminal of the operational amplifier 13. A switch 16 is arranged between the inverting input terminal of the operational amplifier 13 and the output terminal. Both ends of the feedback capacitor are short-circuited with this switch, and at the same time the operational amplifier 13 is set as a unity gain buffer, whereby the output becomes a clamp voltage of the clamp capacitor 12. A control terminal of the clamp switch 16 is supplied with a control pulse via a clamp control line 19.

In an offset elimination circuit 103, a first terminal of a hold capacitor 28 for reading an offset (noise) signal is connected to the output terminal of the operational amplifier 13 via a switch 25. Also, a first terminal of a capacitor 29 for reading a signal obtained by superimposing the noise signal on the optical signal is connected to the output terminal of the operational amplifier 13 via a switch 26. The read switches 25 and 26 are controlled with pulses supplied to control terminals 23 and 24, respectively. Second terminals of the capacitors 28 and 29 are supplied with a predetermined power supply voltage such as a ground. Furthermore, first terminals of the capacitors 28 and 29 are respectively connected to horizontal selection switches 30 and 31. Then, with use of the selection switches 30 and 31, the transmission of the signals to the horizontal common output lines 104 and 105 is controlled. The selection switches 30 and 31 are commonly driven with a signal φHn from a horizontal scanning circuit 38. The signals of the horizontal common output lines 104 and 105 are supplied to an output circuit unit 106.

In FIG. 1, the configuration having the column amplifier has been described but the configuration is not limited to the above-described configuration. As long as the signal from the pixel area is subjected to signal amplification in the fully differential amplifier, such a configuration may be adopted. Instead of using the column amplifier, only a CDS circuit for performing a differential process between the optical signal and the noise signal may be provided.

The amplifier of FIG. 1 is a fully differential amplifier in which a feedback path, which is usually provided, is not provided between the input terminal and the output terminal and the signal amplification is performed. According to such a configuration, even when the parasitic capacitance of the signal path for transmitting the signal to the fully differential amplifier is increased, it is possible to suppress the gain variation due to the parasitic capacitance increase. Also, it is unnecessary to increase the open loop gain and no CMFB circuit needs to be provided, thereby making it possible to operate the fully differential amplifier at a high speed. This result is particularly effective in a case where the number of pixels is increased in the photoelectric conversion apparatus.

Hereinafter, the present invention will be described in detain by way of embodiments. However the present invention is not limited to the following embodiments and can be appropriately changed and combined within the gist of the invention.

First Embodiment

Figure 2:
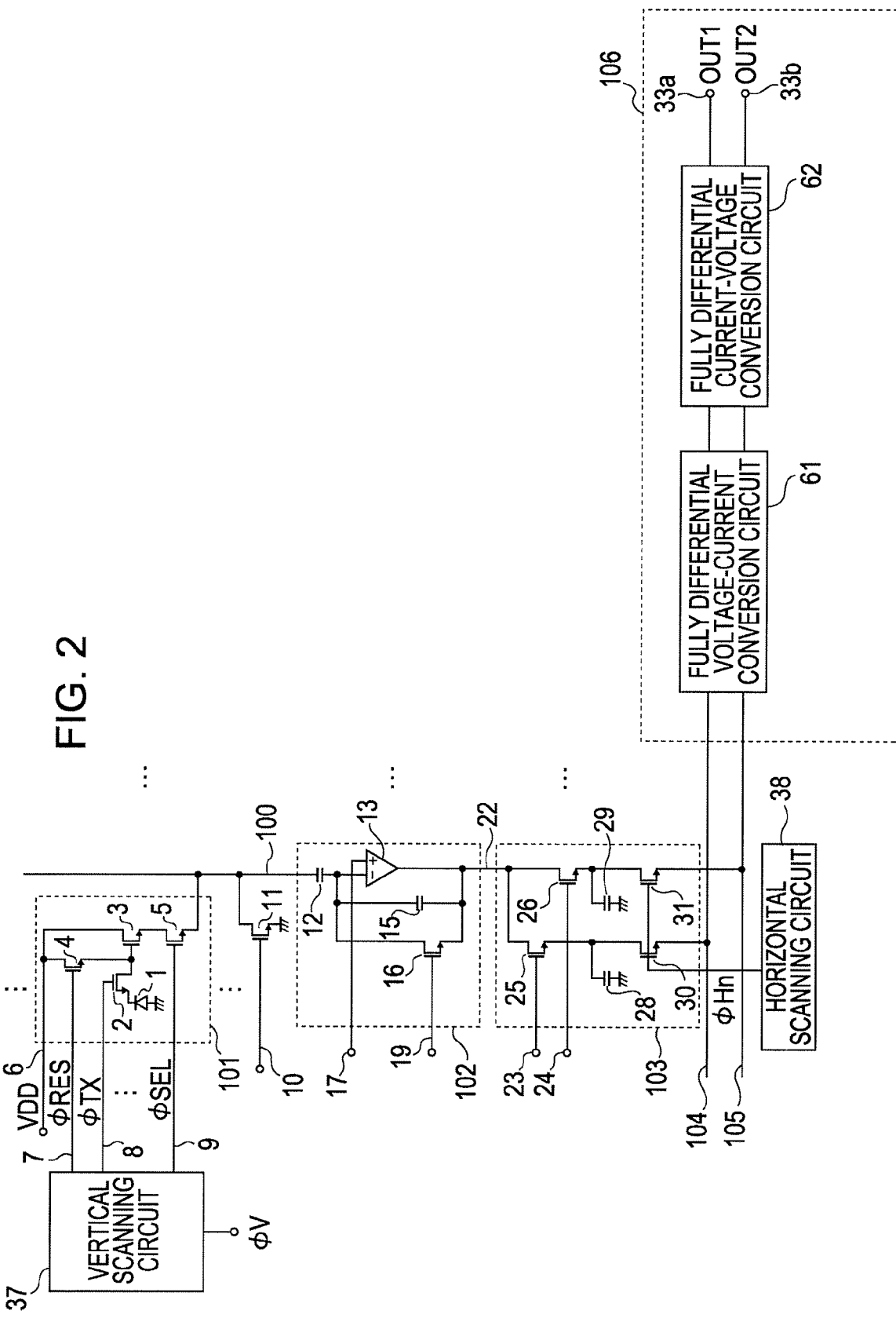
FIG. 2 is a diagram for describing a photoelectric conversion apparatus according to a first embodiment of the present invention.

FIG. 2 illustrates a photoelectric conversion apparatus according to a first embodiment of the present invention. Components having similar functions to those in FIG. 1 are denoted by the same reference numerals and detailed descriptions thereof will be omitted. According to the present embodiment, a fully differential amplifier is used as a configuration included in an output circuit unit, no feedback path is provided between an input terminal and an output terminal in the configuration. When an entire amplifier is observed, a plurality of input terminals including a first input terminal and a second input terminal and a plurality of output terminals including a first output terminal and a second output terminal are provided.

To be more specific, the output circuit unit 106 includes a voltage-current conversion circuit 61 and a current-voltage conversion circuit 62 to which an output of the voltage-current conversion circuit is transmitted. The voltage-current conversion circuit is configured to convert the signals input from the first input terminal and the second input terminal described above into current signals and then outputting the current signals to a third output terminal and a fourth output terminal. After that, the output signals are transmitted to a third input terminal and a fourth input terminal that are input terminals of the current-voltage conversion circuit to be converted into voltages again and the signals are output to the first output terminal and the second output terminal described above in the configuration.

The voltage-current conversion circuit 61 and the current-voltage conversion circuit 62 have the configuration of the fully differential amplifier.

In the output circuit unit 106 according to the present embodiment, the signal is transmitted in one direction from the input to the output. To elaborate, a feed forward type fully differential amplifier having no feedback path between the input terminal and the output terminal is employed.

The signal from the horizontal common output line is transferred to a fully differential voltage-current conversion circuit and the differential output is transferred to the fully differential current-voltage conversion circuit. The differential outputs of the current-voltage conversion circuit 62 are output from output terminals 33a and 33b. Herein, it can also be said that the fully differential amplifier has a non-inverting output terminal and an inverting output terminal with respect to a non-inverting input terminal and an inverting input terminal.

Figure 3:
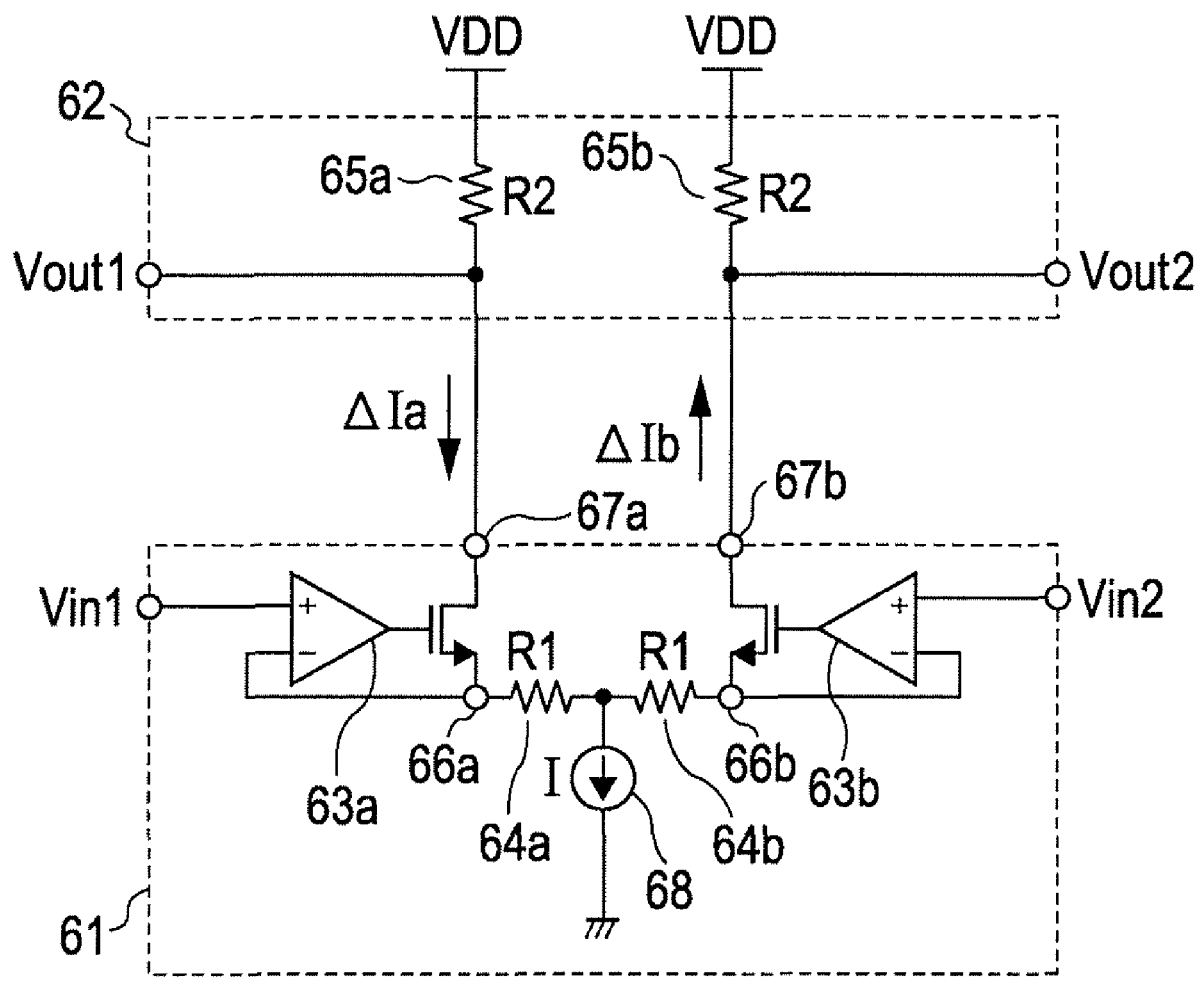
FIG. 3 is an equivalent circuit diagram of a fully differential amplifier of the photoelectric conversion apparatus according to the first embodiment.

FIG. 3 illustrates a specifically embodied circuit of the output circuit unit 106 according to the present embodiment. Components having similar functions to those in FIGS. 1 and 2 are denoted by the same reference numerals and detailed descriptions thereof will be omitted.

Reference symbol Vin1 denotes an inverting input terminal (a first input terminal) and reference symbol Vin2 denotes a non-inverting input terminal (a second input terminal). Signals input from the input terminals are converted into current by resistors 64a and 64b having a resistance value R1 and the currents are output from an output terminal (third output terminal) 67a and an output terminal (fourth output terminal) 67b. Also, the output terminals 67a and 67b function as the input terminals of the current-voltage conversion circuit 62 as well. Then, the currents are converted into voltages by resistors 65a and 65b having a resistance value R2 and then output from the first output terminal Vout1 and the second output terminal Vout2. The resistors 65a and 65b are connected between the output terminals 67a and 67b and a power source VDD in series. A tail current source 68 is configured to determine a current flowing through the differential amplifier.

First, a description will be given of a case where different voltage inputs, in other words, differential signals are input to the first and second input terminals Vin1 and Vin2. With regard to voltage changes ΔVin1 and ΔVin2 in the first and second input terminals Vin1 and Vin2, due to a voltage follower composed of operational amplifiers 63a and 63b, voltage changes in nodes 66a and 66b are also set as ΔVin1 and ΔVin2. Therefore, voltage changes appearing in the output terminals 67a and 67b of the voltage-current conversion circuit 61 are represented by the following expressions when resistance values of the resistors 64a and 64b are set as R1 and the amounts of current change are set as ΔIa and ΔIb.

$$\Delta Ia = (\Delta Vin1 - \Delta Vin2)/(2 \times R1) \quad (3)$$

$$\Delta Ib = -(\Delta Vin1 - \Delta Vin2)/(2 \times R1) \quad (4)$$

Wherein a minus sign indicates the inverse amount of current change.

Next, when the current changes ΔIa and ΔIb that are outputs of the voltage-current conversion circuit 61 occur in the resistors 65a and 65b of the current-voltage conversion circuit 62, while a resistance value of the resistors 65a and 65b is set as R2, the changes appear as the voltage changes ΔVout1 and ΔVout2 of the output terminals 33a and 33b on the basis of the following expressions.

$$\Delta Vout1 = \Delta Ia \times R2 \quad (5)$$
$$= [(\Delta Vin1 - \Delta Vin2) \times R2]/(2 \times R1)$$

$$\Delta Vout2 = \Delta Ib \times R2 \quad (6)$$
$$= [(\Delta Vin1 - \Delta Vin2) \times R2]/(2 \times R1)$$

Therefore, the differential signal obtained in a signal processing unit that performs a differential process after receiving the output of this fully differential amplifier is represented as follow.

$$Vout1 - Vout2 = (\Delta Vin1 - \Delta Vin2) \times R2/R1 \quad (7)$$

A gain with respect to the input difference signal becomes a ratio between the resistance value R2 and the resistance value R1. To elaborate, the reading gain is determined on the basis of a resistance due to a first resistor included in the voltage-current conversion circuit and a second resistor included in the current-voltage conversion circuit.

For this reason, according to the circuit of the present embodiment, it is found out that there is a merit for the gain not to be affected even when the resistors 65a, 65b, 64a, and 64b are changed due to a manufacturing variation.

Next, a case where a common-mode signal is input will be described. The voltages of the first and second output terminals Vout1 and Vout2 are determined on a basis of a voltage drop caused by a current flowing through the resistors 65a and 65b from the power source voltage VDD. When a current of the tail current source 68 is set as I and the first and second input terminals Vin1 and Vin2 are identical to each other, the following expression is established.

$$Vout1 = Vout2 = VDD - (I/2) \times R2 \quad (8)$$

Herein, as an example, a description will be given of changes in output voltages when both the first and second input terminals Vin1 and Vin2 are increased by the same voltage due to noise mixture. The changes in the first and second input terminals Vin1 and Vin2 appear in the node 66a and the node 66b approximately by the same amount due to the voltage follower circuit composed of the operational amplifiers 63a and 63b. However, the potential difference between the nodes 66a and 66b is not changed, and thus no change currents flow in the output terminals 67a and 67b. Therefore, the current values flowing through the resistors 65a and 65b are not changed, and the voltages of the first and second output terminals Vout1 and Vout2, in other words, the common voltage levels are not changed.

$$\Delta Vout1 = \Delta Ia \times R2 = 0 \times R2 \; (\Delta Ia = 0) \quad (9)$$

$$\Delta Vout2 = \Delta Ib \times R2 = 0 \times R2 \; (\Delta Ib = 0) \quad (10)$$

From the above-described configuration, the circuit configuration according to the present embodiment has a characteristic with which it is difficult to transmit the common-mode signal to the output in addition to the noise signal cancel through the differential signal process, thus making it possible to eliminate the common-mode noise with high accuracy.

Also, although not shown in the drawings, if a source follower or an output buffer composed of an operational amplifier is connected to the output terminal the first and second output terminals Vout1 and Vout2, a characteristic fluctuation from an impedance of a circuit connected to the output terminal hardly affects the configuration, which is further preferable.

As described above, if the fully differential amplifier according to the present embodiment is used, it is unnecessary to adjust the common-mode voltage fluctuation. Also, even while the fully differential amplifier is used, it is unnecessary to form a CMFB, which is necessary in conventional cases. Thus, it is possible to realize the photoelectric conversion apparatus in which the noise suppression and the output speed improvement are both satisfactory.

Second Embodiment

Figure 4:
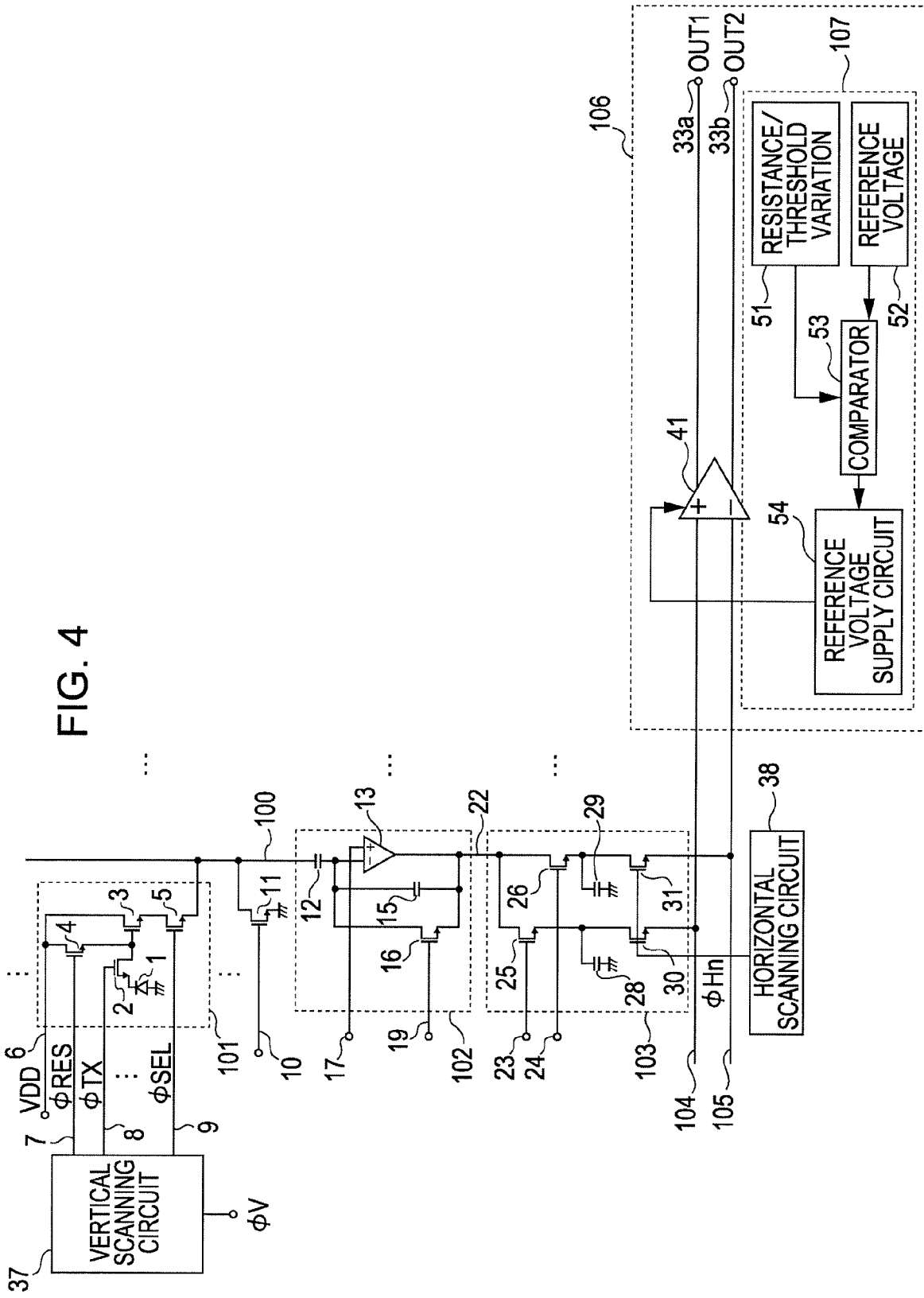
FIG. 4 is a diagram for describing a photoelectric conversion apparatus according to a second embodiment of the present invention.

FIG. 4 illustrates a photoelectric conversion apparatus according to a second embodiment of the present invention. Components having similar functions to those in FIGS. 1 to 3 are denoted by the same reference numerals and detailed descriptions thereof will be omitted. A difference from the first embodiment resides in a circuit format of the output circuit unit 106. In the photoelectric conversion apparatus according to the first embodiment, depending on the characteristic variation of the component elements due to the manufacturing variation, the common-mode variation that the circuit itself originally has may appear in some cases. More specifically, the output voltages of the output terminals 33a and 33b when no voltage difference exists between the horizontal common output lines 104 and 105 and the optical signal is not supplied may have a variation for each photoelectric conversion apparatus in some cases. For example, when the resistance value R2 of the resistors 65a and 65b illustrated in FIG. 3 is larger by ΔR, while the current value flowing through the current source 68 is set as I, the common-mode voltages obtained when there is no voltage difference between the first and second input terminals Vin1 and Vin2 is represented by the following expression.

$$Vout1 = Vout2 = VDD - \tfrac{1}{2} I \times (R + \Delta R) \quad (11)$$

Therefore, the voltages of the first and second output terminals Vout1 and Vout2 are decreased. This voltage decrease may compress the input dynamic range of the circuit that performs a signal process after receiving the output signal in some cases.

Also, although this description is a repetition, even when the common-mode voltage inputs of the first and second input terminals Vin1 and Vin2 are changed due to noise mixture or the like, no influence from the change affects the configuration as has been described in the first embodiment.

The configuration of the output circuit unit 106 according to the present embodiment is provided with a resistor constituting the fully differential amplifier and a monitor circuit 51 configured to monitor a variation of threshold of a MOS transistor in addition to the fully differential amplifier 41. Furthermore, the configuration is composed of a comparator 53 for comparing an output of the monitor circuit with a reference voltage 52 and a reference voltage supply circuit 54 for receiving an output of the comparator 53 and changing the common-mode voltages of the fully differential amplifier. With these configurations, the common-mode voltage fluctuation of the fully differential amplifier 41 due to the resistances and manufacturing variation of the MOS transistors is suppressed.

Figure 5:
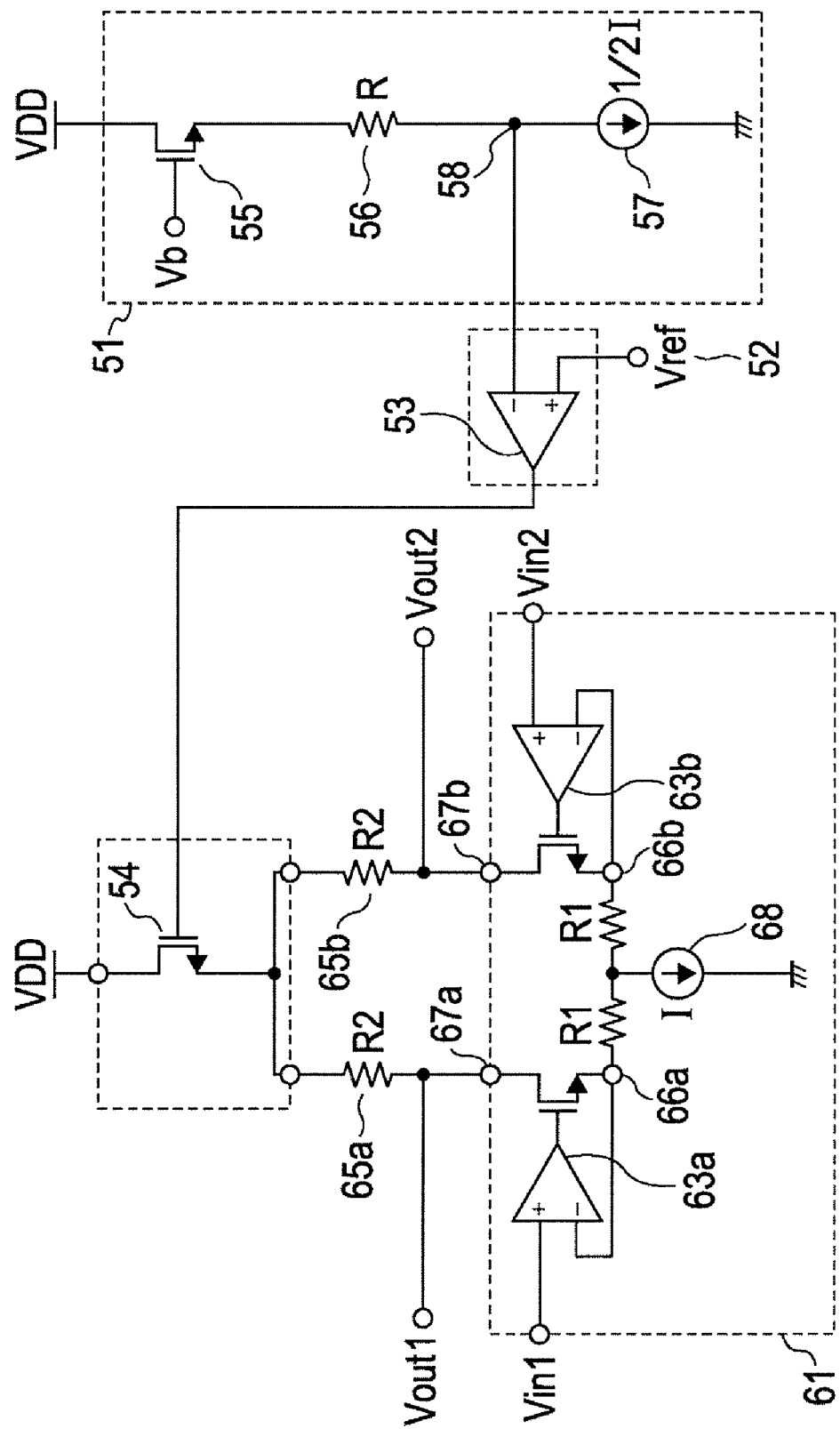
FIG. 5 is an equivalent circuit diagram of an output circuit unit of the photoelectric conversion apparatus according to the second embodiment.

FIG. 5 illustrates a specific circuit example. Components having similar functions to those in FIG. 4 are denoted by the same reference numerals and detailed descriptions thereof will be omitted. The monitor circuit 51 allows a current half of the current I flowing through the tail current source 68 of the fully differential amplifier to flow through a resistor 56 having the same resistance value R2 as the resistors 65a and 65b that are the resistance for the fully differential amplifier 41 by using a current source 57. Also, an inverting input terminal of the comparator 53 is connected to one terminal 58 of the resistor 56 and a voltage generated on the basis of the resistor 56 with a current from the current source 57 is input to the comparator 53. The non-inverting input terminal of the comparator 53 is connected to the reference voltage 52 Vref and the output of the comparator 53 is connected to a gate of the MOS transistor 54 in the reference voltage supply circuit.

A description will be given of a case where the resistance is increased by ΔR in the above-described manner. In the resistor 56, the voltage of the terminal 58 is decreased by the same amount as ΔR×½ I which is equal to the voltage fluctuation generated in the resistors 65a and 65b. This change is inverted by the comparator 53, and as a voltage increase signal a gate voltage of the MOS transistor 54 is increased. With this configuration, the voltages of the output terminals 67a and 67b are increased and the common-mode voltages are also increased.

In addition, similarly, a common-mode level variation due to a change in a threshold of an NMOS transistor constituting the fully differential amplifier can also be cancelled. For example, when the threshold of the NMOS transistor is increased by ΔVth, the voltage necessary for the NMOS transistor 54 to flow the tail current 68 (I) is increased by ΔVth. For this reason, a voltage on a drain side of the reference voltage supply circuit 54 is decreased by ΔVth, and the output voltages of the first and second output terminals Vout1 and Vout2 are also decreased by ΔVth. On the other hand, a drain voltage of a constant voltage setting MOS transistor 55 is also decreased by ΔVth with the similar reason. Thus, with the comparator 53, as the voltage increases, the gate voltage of the MOS transistor 54 is increased. With this configuration, the voltages of the output terminals 67a and 67b are increased and the common-mode output voltages are also increased, thus making it possible to perform a satisfactory differential process.

Herein, the manufacturing variation means variations of the resistance values and thresholds caused in each wafer or each chip in a semiconductor process. For example, when a diffusion resistor is used, the manufacturing variation refers to a phenomenon in which the resistance values in a unit area for each wafer or each chip are varied due to variations in an impurity implantation and a diffusive concentration. Also, in a case of the threshold of the MOS transistor, the manufacturing variation refers to a phenomenon of variations in a channel dope under a gate oxide film, an impurity density in a well, and the like. These phenomena show constant variations. The variation of each element in the photoelectric conversion apparatus can be significantly alleviated by arranging the elements close to each other on a layout. For example, by arranging the resistors 65a 65b, 56, and the like according to the present embodiment close to each other, it is possible to reduce the variation.

According to the present embodiment, as the common-mode voltage fluctuation due to the manufacturing variation is alleviated, it is possible to realize the photoelectric conversion apparatus in which the noise suppression and the output speed improvement are both satisfactory.

Third Embodiment

Figure 6:
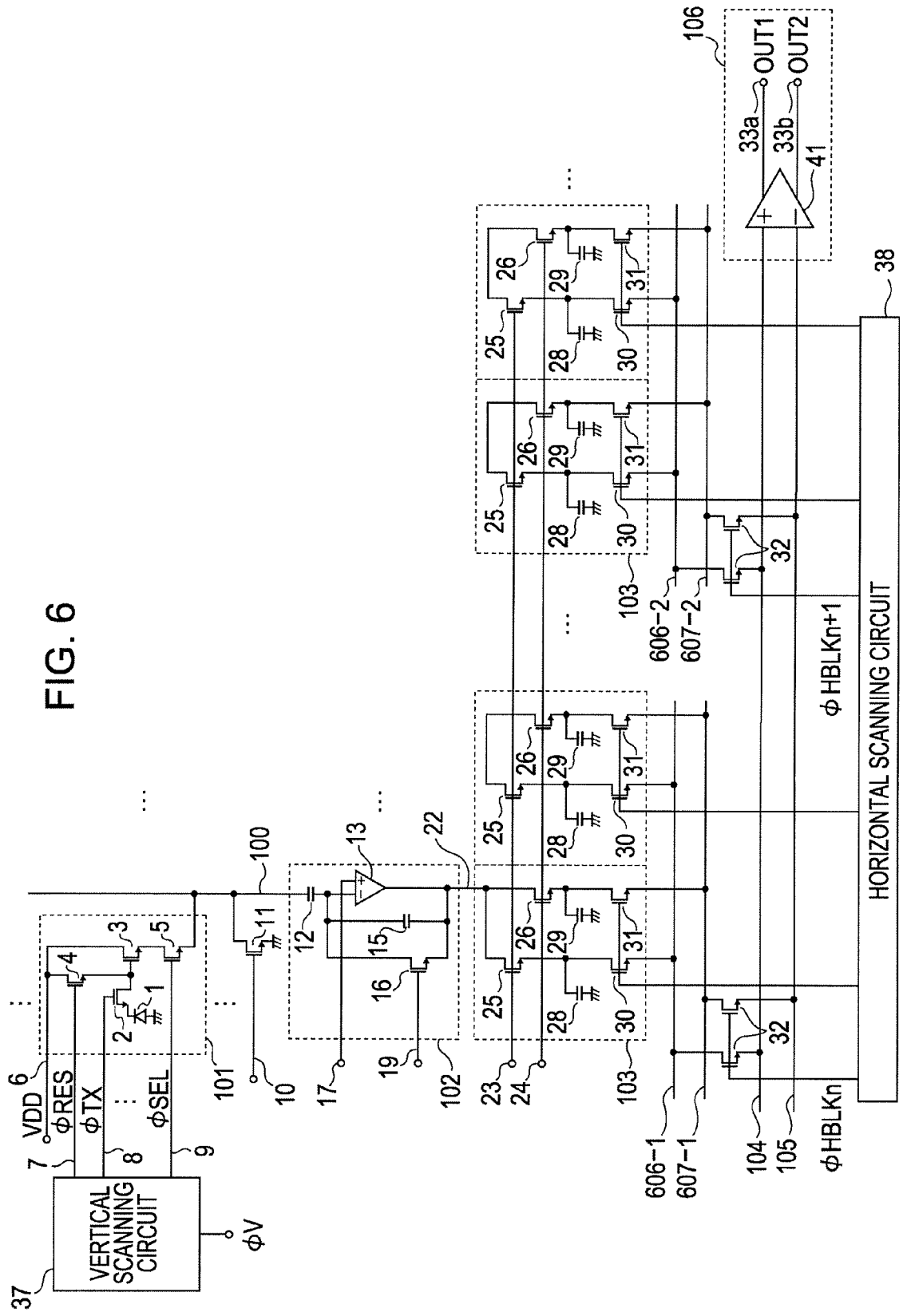
FIG. 6 is a diagram for describing a photoelectric conversion apparatus according to a third embodiment of the present invention.

FIG. 6 illustrates a photoelectric conversion apparatus according to a third embodiment of the present invention. Components having similar functions to those in the above-described embodiments are denoted by the same reference numerals and detailed descriptions thereof will be omitted. Components having similar functions to those of the configurations in the drawings according to the above-described embodiments are denoted by the same reference numerals and detailed descriptions thereof will be omitted. According to the present embodiment, it is characterized in that after the signal output from the pixel area is temporarily held in the hold capacitor, before the signal is transferred to the signal path for transferring the signal to the amplifier, blocks are formed for a plurality of hold capacitors. In other words, it can be said that a block formation area is provided for connecting between the switches for transferring the signal from the hold capacitor to the horizontal common output line. The outputs of the selection switches 30 and 31 are connected to block horizontal common lines 606 and 607. The block horizontal common lines 606 and 607 are connected to the horizontal common output lines 104 and 105 via horizontal block selection switches 32. By adopting such a circuit configuration, the total number of switches to be connected to the horizontal common output line can be reduced and the parasitic capacitance of the horizontal common output line can be lowered. At the time of adopting such a configuration, the signal can be read at a still higher speed as compared with the first and second embodiments.

Fourth Embodiment

Figure 7:
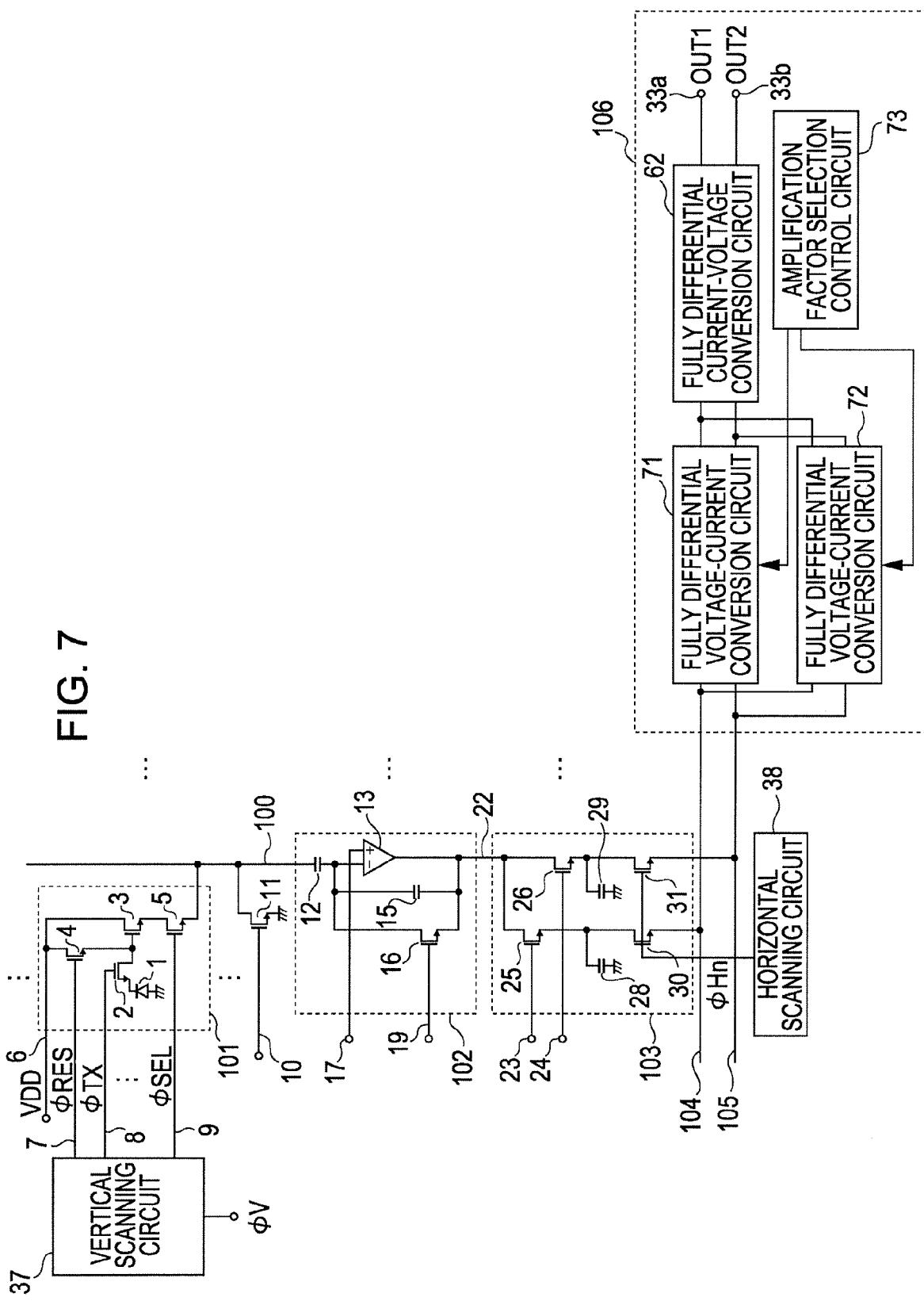
FIG. 7 is a diagram for describing a photoelectric conversion apparatus according to a fourth embodiment of the present invention.

FIG. 7 illustrates a photoelectric conversion apparatus according to a fourth embodiment of the present invention. Components having similar functions to those of the configurations in the drawings according to the above-described embodiments are denoted by the same reference numerals and detailed descriptions thereof will be omitted. According to the present embodiment, a plurality of the fully differential voltage-current conversion circuits denoted by reference numerals 71 and 72 and described in the first embodiment for example are provided. The specific circuit is similar to that of FIG. 3. The resistor 64a and 64b have different resistance values in the respective fully differential voltage-current conversion circuits. With use of a gain selection control circuit 73, it is possible to switch the connection of the plurality of fully differential voltage-current conversion circuits. With this configuration, it is possible to switch the gain of the output circuit unit 106. Also, as described in the second embodiment, a configuration for alleviating the common-mode voltage fluctuation due to the variation of elements constituting the amplifier may be added. Also, as described in the third embodiment, the block formation is performed for reading.

According to the present embodiment, in addition to the above-described embodiments, furthermore, it is possible to vary the gain.

Fifth Embodiment

Figure 8:
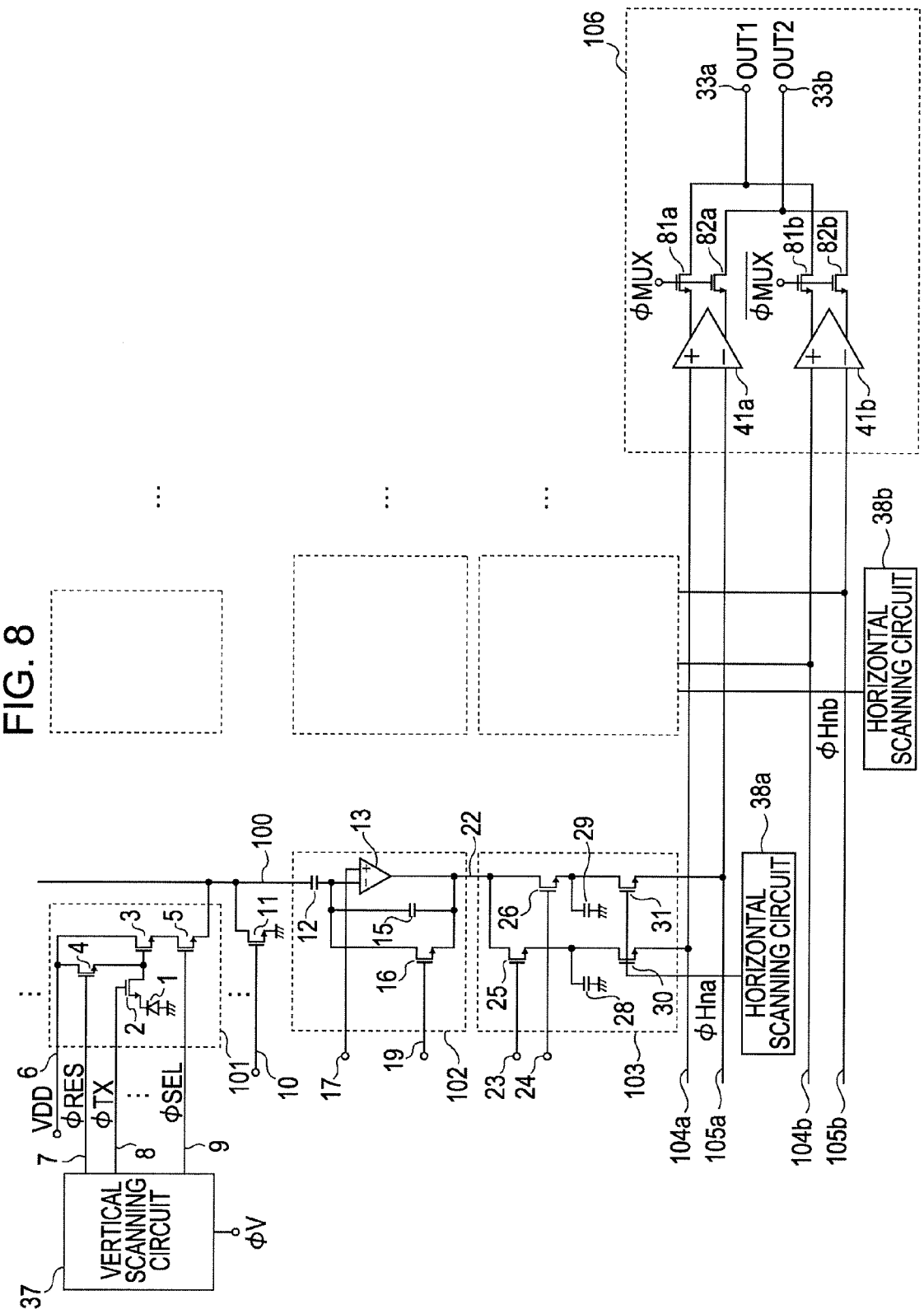
FIG. 8 is a diagram for describing a photoelectric conversion apparatus according to a fifth embodiment of the present invention.

FIG. 8 illustrates a photoelectric conversion apparatus according to a fifth embodiment of the present invention. According to the present embodiment, such a configuration is adopted that the output from the pixel area is output to a plurality of pairs of the horizontal common output lines 104 and 105 and a plurality of the fully differential amplifiers 41a and 41b are used for reading. Then, differential outputs of the fully differential amplifiers are switched by switches 81 and 82 in a time-series manner and the signals from the plurality of amplifiers from the output terminals 33a and 33b are rearranged in a time-series manner to be output.

Figure 9:
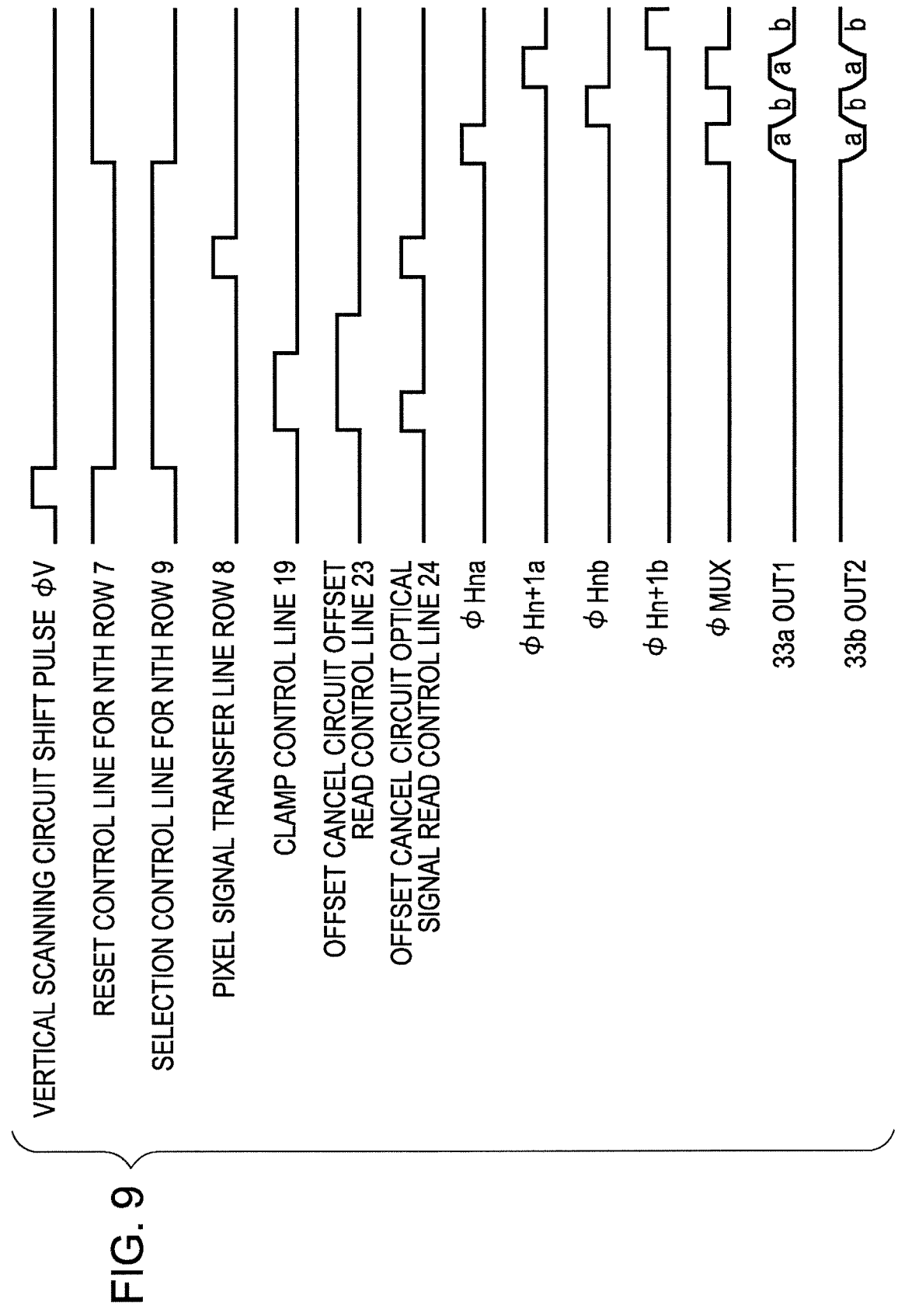
FIG. 9 is a timing chart for the photoelectric conversion apparatus according to the fifth embodiment.

FIG. 9 illustrates a timing chart. Horizontal common output lines 104a, 105a, 104b, and 105b are outputs of the horizontal scanning circuits 38a and 38b. In accordance with φHna and φHnb, the signals are output at mutually reversed phase timings. The output signals of the fully differential amplifiers 41a and 41b are output at the mutually reversed phase timings. When φMUX is high, switches 81a and 82a have a continuity to output the signal of the fully differential amplifier 41a. Then, at the time of φMUXlow, switches 81b and 82b have a continuity to output the signal of the fully differential amplifier 41b. With the above-described operations, the outputs of the fully differential amplifiers can be output from one part of differential output terminals in a time-series manner.

The outputs of the fully differential amplifiers can be output by the one part of differential output terminal, and it is possible to decrease the number of output pads based on the differential output format.

According to the present embodiment described above, in addition to the effects of the above-described embodiment, the increase in the number of the output pads is suppressed and it is possible to reduce the chip area.

Application to Image Sensing System

Figure 10:
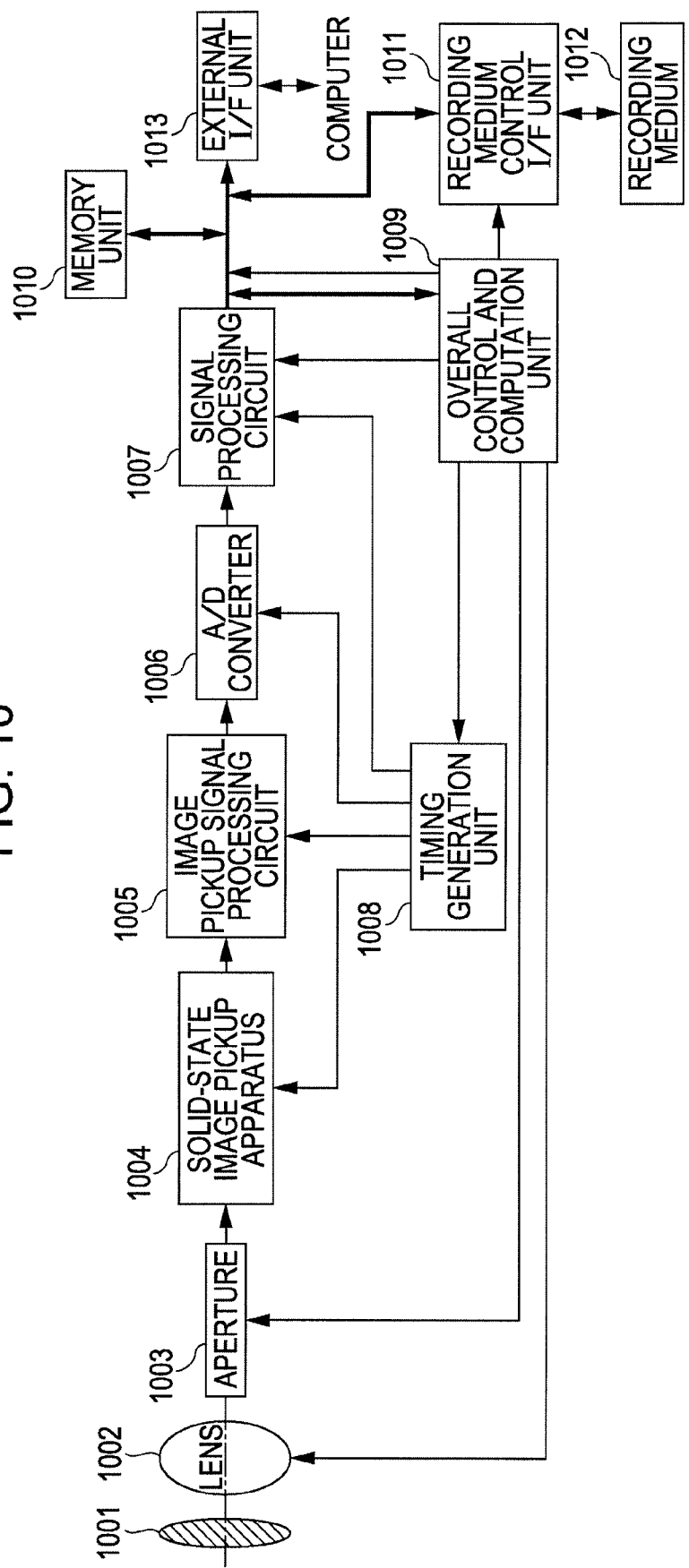
FIG. 10 is a block diagram for describing an image sensing system.
Figure 11:
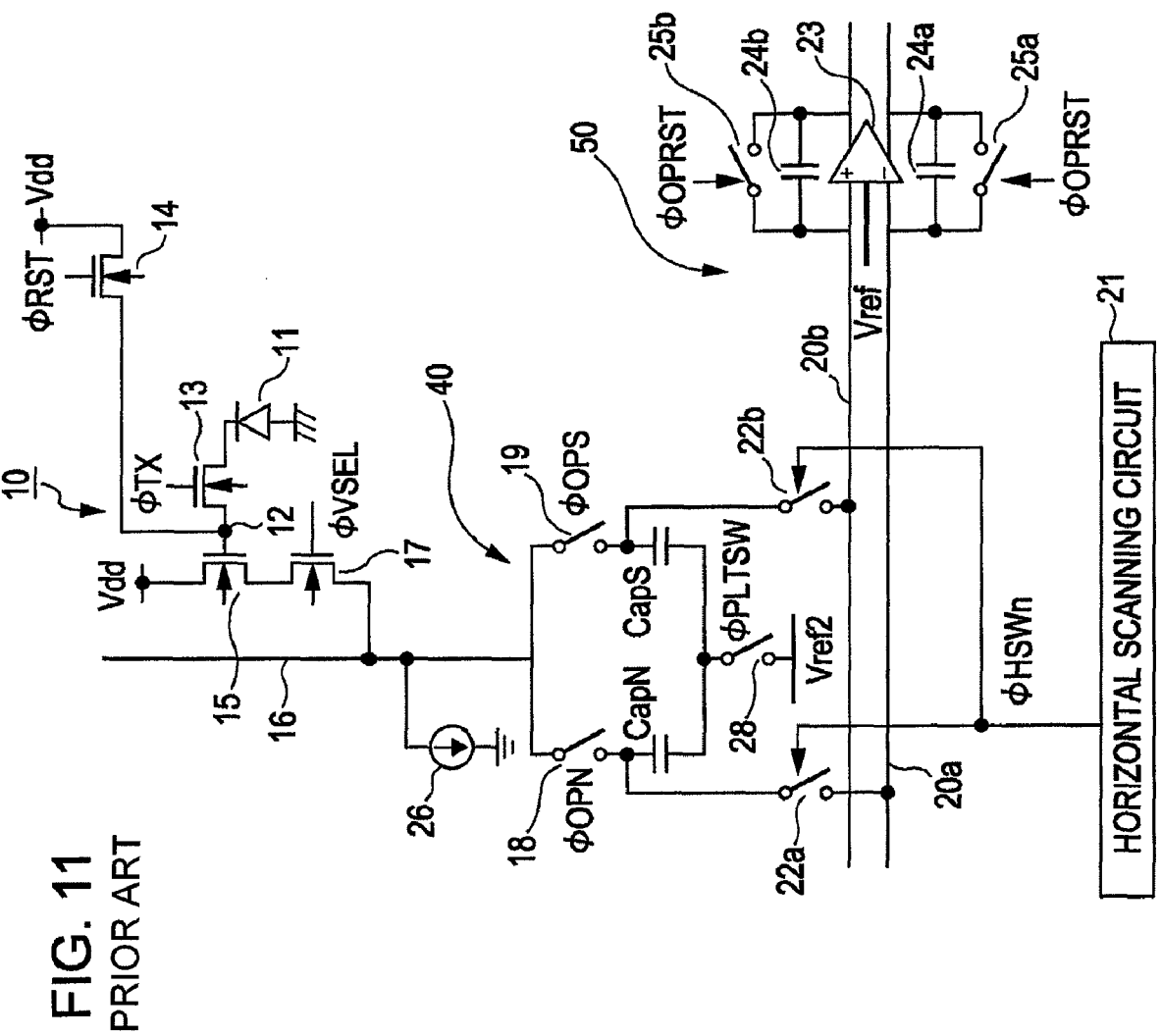
FIG. 11 is a circuit diagram of a photoelectric conversion apparatus.

FIG. 10 is a configuration diagram of a solid-state image sensing system which uses the photoelectric conversion apparatus described in the first to fifth embodiments. In FIG. 10, a barrier 1001 doubles as a protection for a lens 1002 and a main switch, a lens 1002 forms an optical image of an object on a photoelectric conversion apparatus 1004, and an aperture 1003 varies illumination of a light passing through the lens. The photoelectric conversion apparatus 1004 is configured to take in the object whose image has been formed by the lens 1002 as an image signal, an image pickup signal processing circuit 1005 is configured to perform various corrections, clamping, and other processes on the image signal output from the photoelectric conversion apparatus 1004. An A/D converter 1006 is configured to perform analog/digital conversion on the image signal output from the photoelectric conversion apparatus 1004, a signal processing unit 1007 is configured to perform various corrections, data compression, and other processes on the image signal output from the A/D converter 1006, and a timing generation unit 1008 is configured to output various timing signals to the photoelectric conversion apparatus 1004, the image pickup signal processing circuit 1005, the A/D converter 1006, and the signal processing unit 1007. An overall control and computation unit 1009 controls various computations and the entire still video camera, a memory unit 810 is configured to temporarily store image data, and a recording medium control interface unit 811 is configured to perform recording or reading with respect to a recording medium. A removable recording medium 812 is composed of a semiconductor memory and the like for recording or reading the image data, and an external interface (I/F) unit 813 is configured to communicate with an external computer or the like.

Next, operations in FIG. 10 will be described. In accordance with opening of the barrier 1001, a main power supply, a power supply for a control system, and a power supply for an image pickup system such as the A/D converter 1006 are sequentially turned ON. After that, the overall control and computation unit 1009 opens the aperture 1003 to control the light exposure. The signal output from the photoelectric conversion apparatus 1004 passes through the image pickup signal processing circuit 1005 to be output to the A/D converter 1006. The A/D converter 1006 performs the A/D conversion on the signal to be output to the signal processing unit 1007. The signal processing unit 1007 performs a computation to determine the light exposure in the overall control and computation unit 1009 on the basis of the data.

A luminance is determined as a result of this photometry, and the overall control and computation unit 1009 controls the aperture in accordance with the result. Next, a high frequency component is taken out from the signal that has been output from the photoelectric conversion apparatus 1004 to perform a computation for measuring a distance to the object in the overall control and computation unit 1009. After that, the lens is driven to determine whether a focused state is obtained or not. When it is determined that the focused state is not obtained, the lens is driven again to measure the distance.

Then, after the focused state is confirmed, main exposure is started. When the exposure is ended, the image pickup signal output from the photoelectric conversion apparatus 1004 is subjected to corrections and the like in the image pickup signal processing circuit 1005 and A/D conversion in the A/D converter 1006, and is processed in the signal processing unit 1007. The image data processed in the signal processing unit 1007 is accumulated in the memory unit 810 by the overall control and computation unit 1009. After that, the image data accumulated in the memory unit 810 passes through the recording medium control I/F unit in the removable recording medium 812 such as the semiconductor memory via the recording medium control I/F unit in accordance with the control by the overall control and computation unit 1009. Also, the image data may be directly input to a computer via the external I/F unit 813 to perform processing on the image.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-242930 filed Sep. 7, 2006, which is hereby incorporated by reference herein in its entirety.

What is claimed is:

1. A photoelectric conversion apparatus, comprising:
a pixel area where a plurality of pixels are arranged;
an amplifier configured to amplify a signal from the pixel area; and
a plurality of signal paths for transmitting signals from the pixel area to the amplifier,
wherein the amplifier is a fully differential amplifier that includes a plurality of input terminals, including a first input terminal and a second input terminal to which the signals from the plurality of signal paths are supplied, and a plurality of output terminals, including a first output terminal and a second output terminal, wherein the plurality of input terminals and the plurality of output terminals have no feedback path provided therebetween, and wherein the fully differential amplifier further includes:

a voltage-current conversion circuit including a third output terminal and a fourth output terminal for outputting a differential signal between the signals supplied to the first input terminal and the second input terminal, and a current-voltage conversion circuit including a third input terminal and a fourth input terminal to which the differential signal from the voltage-current conversion circuit is supplied and using the first output terminal and the second output terminal as output terminals.

2. The photoelectric conversion apparatus according to claim 1, wherein the voltage-current conversion circuit has a fully differential type configuration in which an input voltage is subjected to current conversion by using a first resistor, and the current-voltage conversion circuit has a fully differential type configuration in which a signal after the current conversion is subjected to voltage conversion by using a second resistor and a third resistor connected in series to the third output terminal and the fourth output terminal.

3. The photoelectric conversion apparatus according to claim 2, wherein a gain of the fully differential amplifier is switched by switching the first resistor.

4. The photoelectric conversion apparatus according to claim 1, wherein the fully differential amplifier includes a resistor and a MOS transistor, and the photoelectric conversion apparatus further comprises:

a monitor circuit configured to monitor characteristic variations of the resistor and the MOS transistor, and a reference voltage supply circuit configured to set a bias voltage of the fully differential amplifier based on a result of a comparison between an output of the monitor circuit and a reference voltage.

5. The photoelectric conversion apparatus according to claim 1, further comprising:

a plurality of hold capacitors for respectively holding signals from the plurality of pixels;

a plurality of first switches respectively configured to transfer signals of the plurality of hold capacitors;

a plurality of block formation areas for connecting outputs of the plurality of first switches in a unit of a predetermined number; and a plurality of second switches respectively configured to transfer signals of the plurality of block formation areas to the plurality of signal paths.

6. The photoelectric conversion apparatus according to claim 1, further comprising a plurality of amplifiers, wherein an output from at least one of the plurality of the amplifiers is switched in a time division manner to be output from one read path.

7. The photoelectric conversion apparatus according to claim 1, wherein each pixel includes a photoelectric conversion element, a signal supplied to the first input terminal is a signal obtained by superposing a noise signal on a signal based on a charge generated through photoelectric conversion of the photoelectric conversion element, and a signal supplied to the second input terminal is the noise signal.

8. A photoelectric conversion apparatus according to claim 1, wherein the photoelectric conversion apparatus is incorporated in an image sensing system that includes:

an optical system configured to optically form an image on the photoelectric conversion apparatus; and a signal processing circuit configured to process the output signal from the photoelectric conversion apparatus.

9. A photoelectric conversion apparatus, comprising:

a pixel area where a plurality of pixels are arranged;

an amplifier configured to amplify a signal from the pixel area; and a plurality of signal paths for transmitting signals from the pixel area to the amplifier, wherein the amplifier is a fully differential amplifier that includes a plurality of input terminals, including a first input terminal and a second input terminal to which the signals from the plurality of signal paths are supplied, and a plurality of output terminals, including a first output terminal and a second output terminal, wherein a gain of the fully differential amplifier is determined based on a resistor inside the fully differential amplifier, and wherein the fully differential amplifier further includes:

a voltage-current conversion circuit including a third output terminal and a fourth output terminal for outputting a differential signal between the signals supplied to the first input terminal and the second input terminal, and a current-voltage conversion circuit including a third input terminal and a fourth input terminal to which the differential signal from the voltage-current conversion circuit is supplied and using the first output terminal and the second output terminal as output terminals.

* * * * *